United States Patent
Kim et al.

(10) Patent No.: US 11,081,062 B2
(45) Date of Patent: Aug. 3, 2021

(54) CURRENT SENSING DEVICE AND ORGANIC LIGHT EMITTING DISPLAY DEVICE INCLUDING THE SAME

(71) Applicant: LG Display Co., Ltd., Seoul (KR)

(72) Inventors: Hyuckjun Kim, Paju-si (KR); Bumsik Kim, Paju-si (KR); Seungtae Kim, Paju-si (KR); Kyoungdon Woo, Paju-si (KR); Myunggi Lim, Paju-si (KR); Byungjae Lee, Paju-si (KR); Minkyu Song, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 92 days.

(21) Appl. No.: 16/573,675

(22) Filed: Sep. 17, 2019

(65) Prior Publication Data

US 2020/0105203 A1 Apr. 2, 2020

(30) Foreign Application Priority Data

Sep. 27, 2018 (KR) .................. 10-2018-0115170

(51) Int. Cl.
*G09G 3/3283* (2016.01)
*G09G 3/3233* (2016.01)
(Continued)

(52) U.S. Cl.
CPC .......... *G09G 3/3283* (2013.01); *G01R 17/02* (2013.01); *G09G 3/3233* (2013.01);
(Continued)

(58) Field of Classification Search
CPC .. G09G 3/3283; G09G 3/3233; G09G 3/3258; G09G 2300/0857; G09G 2310/0294; G09G 2310/0272; G09G 2320/041; G09G 3/3291; G09G 2320/0295; G09G 2320/045; G09G 2300/0452; G09G 3/006; G09G 3/3225; G01R 19/0092; G01R 17/02; G01R 17/06
See application file for complete search history.

(56) References Cited

U.S. PATENT DOCUMENTS

| | | | |
|---|---|---|---|
| 9,984,620 B2* | 5/2018 | Lee .................. | G09G 3/006 |
| 2016/0012798 A1* | 1/2016 | Oh .................. | G09G 3/325 |
| | | | 345/205 |

(Continued)

FOREIGN PATENT DOCUMENTS

| KR | 10-2016-0096275 A | 8/2016 |
|---|---|---|
| KR | 10-2017-0023292 A | 3/2017 |
| KR | 10-2018-0065678 A | 6/2018 |

*Primary Examiner* — Patrick N Edouard
*Assistant Examiner* — Douglas M Wilson
(74) *Attorney, Agent, or Firm* — Fenwick & West LLP

(57) ABSTRACT

The current sensing device in the present disclosure comprises a plurality of sensing units each of which is connected to a sensing channel. The sensing unit may comprise a reference current generator generating a reference current; a current comparator outputting a comparator output signal based on a pixel current input through the sensing channel and the reference current, and removing an offset deviation component included in the pixel current and the reference current by using a reset current externally applied; and an edge triggered data flip-flop outputting a digital sensing value corresponding to the pixel current based on the comparator output signal.

11 Claims, 14 Drawing Sheets

(51) Int. Cl.
*G09G 3/3258* (2016.01)
*G01R 17/02* (2006.01)
*H04N 5/357* (2011.01)

(52) U.S. Cl.
CPC ... *G09G 3/3258* (2013.01); *G09G 2300/0857* (2013.01); *G09G 2310/0272* (2013.01); *G09G 2310/0294* (2013.01); *H04N 5/3575* (2013.01)

(56) References Cited

U.S. PATENT DOCUMENTS

2016/0225314 A1   8/2016  Lee
2017/0188427 A1*  6/2017  Cok ..................... G09G 3/3208

* cited by examiner

2

CURRENT SENSING DEVICE AND ORGANIC LIGHT EMITTING DISPLAY DEVICE INCLUDING THE SAME

This application claims the benefit of Republic of Korea Patent Application No. 10-2018-0115170 filed on Sep. 27, 2018, which is incorporated by reference in its entirety.

BACKGROUND

Field of the Technology

The present disclosure relates to an organic light-emitting display device, and more particularly, to a current sensing device and the organic light-emitting display device including the same.

Discussion of the Related Art

An active matrix organic light emitting display device includes organic light emitting diodes (OLEDs) capable of emitting light and has many advantages, such as a fast response time, a high emission efficiency, a high luminance, a wide viewing angle, and the like.

The organic light emitting display device arranges pixels each including an OLED in a matrix form and adjusts a luminance of the pixel based on a grayscale of video data. Each pixel includes a driving thin film transistor TFT controlling a pixel current flowing through the OLED based on a voltage Vgs between a gate electrode and a source electrode of the driving TFT. The driving characteristics of the OLED and the driving TFT are changed by temperature or deterioration. If the driving characteristics of the OLED and/or the driving TFT are different for each pixel, even if the same image data is written to pixels, the luminance between the pixels is different, so that it is difficult to realize a desired image quality.

An external compensation scheme is well-known for compensating for the change of the driving characteristics of the OLED or the driving TFT. The external compensation scheme senses the change of the driving characteristics of the OLED or the driving TFT and modulates image data based on the sensing results.

SUMMARY

An organic light emitting display device uses a current integrator for sensing a change of driving characteristics of an OLED or a driving TFT. Since the current integrator is connected to per sensing channel, a plurality of current integrator may be equipped in the organic light emitting display device. The current integrator is advantageous in reducing a sensing time by enabling low current and high-speed sensing, but it is vulnerable to noise and an offset error. The noise is caused by variations of a reference voltage applied to a non-inverting input terminal of the current integrator and noise source differences between the sensing lines connected to an inverting input terminal of the current integrator. The offset error is due to an offset voltage deviation between the current integrators. Since this noise or offset error is amplified in the current integrator and reflected in an integral value, the sensing result may be distorted. When sensing performance is lowered, the driving characteristics of the OLED or the driving TFT may not be compensated accurately.

Accordingly, the present disclosure provides a current sensing device which can reduce sensing result distortion due to noise or an offset error and an organic light emitting display device including the current sensing device.

The current sensing device in the present disclosure comprises a plurality of sensing units each of which is connected to a sensing channel. The sensing unit may comprise a reference current generator generating a reference current; a current comparator outputting a comparator output signal based on a pixel current input through the sensing channel and the reference current, and removing an offset deviation component included in the pixel current and the reference current by using a reset current externally applied; and an edge triggered data flip-flop outputting a digital sensing value corresponding to the pixel current based on the comparator output signal.

BRIEF DESCRIPTION OF THE DRAWINGS

The accompanying drawings, which are included to provide a further understanding of the disclosure and are incorporated in and constitute a part of this specification, illustrate embodiments of the disclosure and together with the description serve to explain the principles of the disclosure. In the drawings.

DETAILED DESCRIPTION

Figure 1:
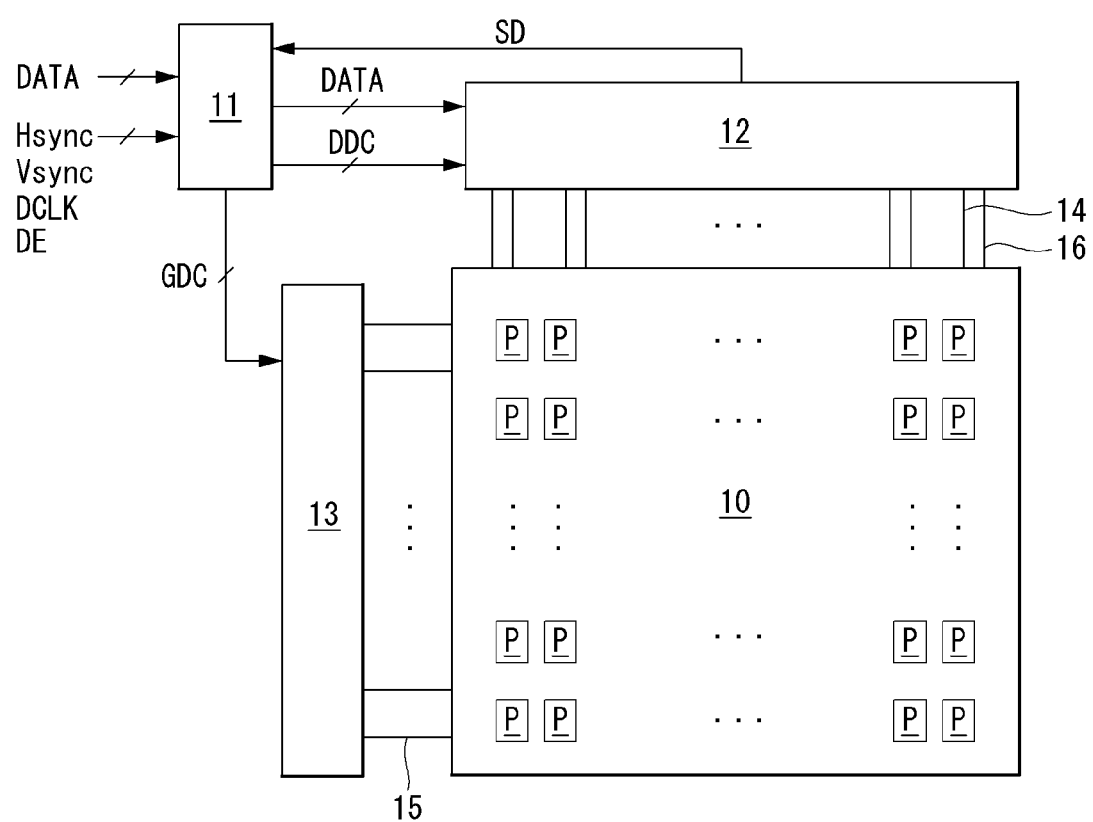
FIG. 1 shows a block diagram illustrating an organic light emitting display device according to an embodiment of the present disclosure.

The advantages and features of the present disclosure and methods of accomplishing the same may be understood more readily by reference to the following detailed descriptions of exemplary embodiments and the accompanying drawings. The present disclosure may, however, be embodied in many different forms and should not be construed as being limited to the exemplary embodiments set forth herein. Rather, these exemplary embodiments are provided so that this disclosure will be thorough and complete and will fully convey the concept of the present disclosure to those skilled in the art, and the present disclosure is defined by the appended claims.

The shapes, sizes, percentages, angles, numbers, etc. shown in the figures to describe the exemplary embodiments of the present disclosure are merely examples and not limited to those shown in the figures. Like reference numerals denote like elements throughout the specification. When the terms 'comprise', 'have', 'include' and the like are used, other parts may be added as long as the term 'only' is not used. The singular forms may be interpreted as the plural forms unless explicitly stated.

The elements may be interpreted to include an error margin even if not explicitly stated.

When the position relation between two parts is described using the terms 'on', 'over', 'under', 'next to' and the like, one or more parts may be positioned between the two parts as long as the term 'immediately' or 'directly' is not used.

It will be understood that, although the terms first, second, etc., may be used to describe various elements, these elements should not be limited by these terms. These terms are only used to distinguish one element from another element. Thus, a first element referred to below may be a second element within the scope of the present disclosure.

Like reference numerals substantially denote like elements throughout the specification.

In the present disclosure, the pixel circuit and the gate driver formed on the substrate of a display panel may be implemented by a TFT of an n-type MOSFET structure, but the present disclosure is not limited thereto so the pixel circuit and the gate driver may be implemented by a TFT of a p-type MOSFET structure. The TFT or the transistor is the element of 3 electrodes including a gate, a source and a drain. The source is an electrode for supplying a carrier to the transistor. Within the TFT the carrier begins to flow from the source. The drain is an electrode from which the carrier exits the TFT. That is, the carriers in the MOSFET flow from the source to the drain. In the case of the n-type MOSFET NMOS, since the carrier is an electron, the source voltage has a voltage lower than the drain voltage so that electrons can flow from the source to the drain. In the n-type MOSFET, a current direction is from the drain to the source because electrons flow from the source to the drain. On the other hand, in the case of the p-type MOSFET PMOS, since the carrier is a hole, the source voltage has a voltage higher than the drain voltage so that holes can flow from the source to the drain. In the p-type MOSFET, a current direction is from the source to the drain because holes flow from the source to the drain. It should be noted that the source and drain of the MOSFET are not fixed. For example, the source and drain of the MOSFET may vary depending on the applied voltage. Therefore, in the description of the present disclosure, one of the source and the drain is referred to as a first electrode, and the other one of the source and the drain is referred to as a second electrode.

Hereinafter, various embodiments of the present disclosure will be described in detail with reference to the accompanying drawings. In the following embodiments, an electroluminescent display device will be described mainly with respect to an organic light emitting display device including organic light emitting material. However, the present disclosure is not limited to the organic light emitting display device, but may be applied to an inorganic light emitting display device including inorganic light emitting material.

In describing the present disclosure, detailed descriptions of well-known functions or configurations related to the present disclosure will be omitted to avoid unnecessary obscuring the present disclosure.

Figure 2:
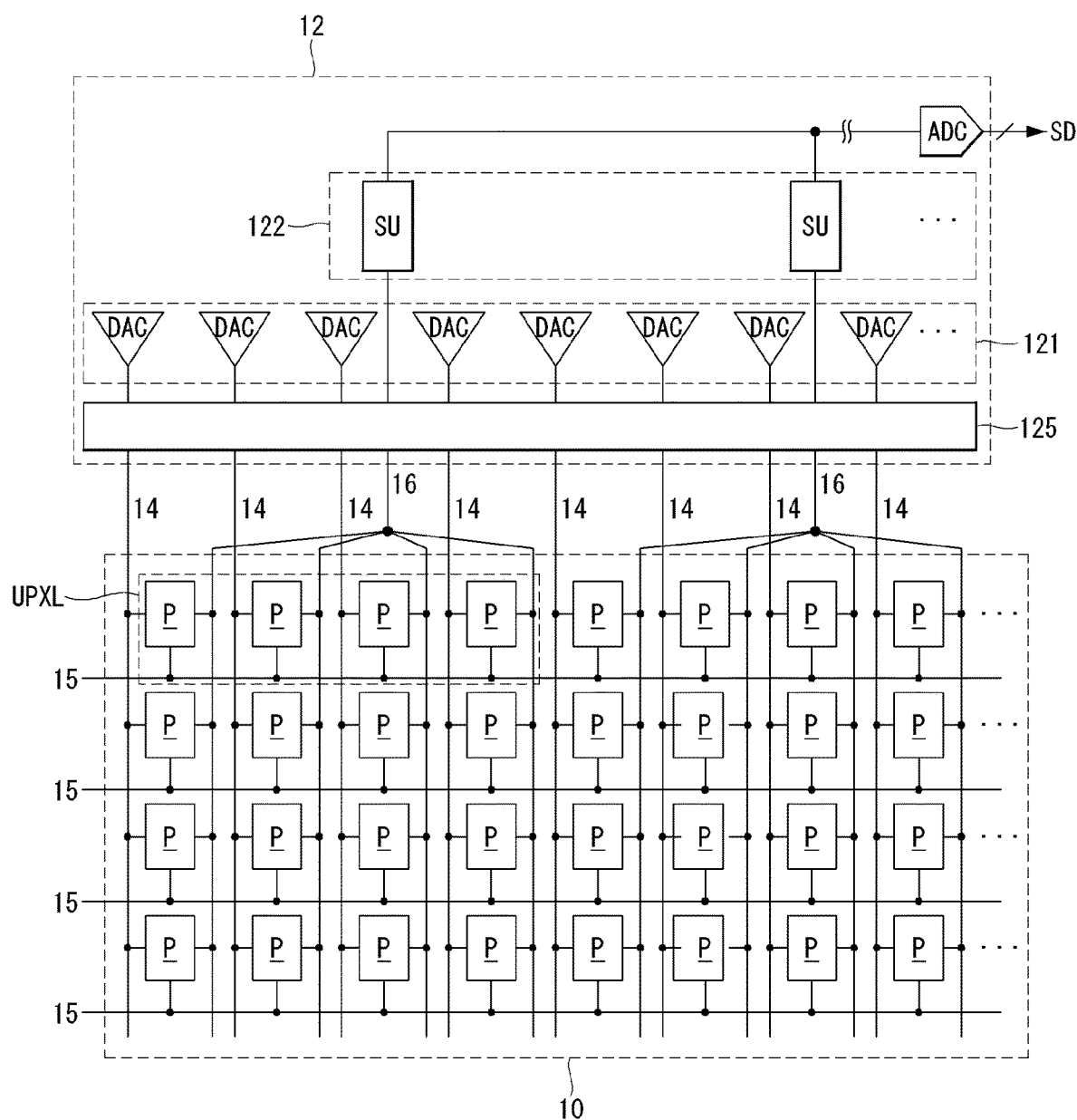
FIG. 2 shows the connecting configuration of the data driving circuit including the current sensing device according to an embodiment of the present disclosure and a pixel array.
Figure 3:
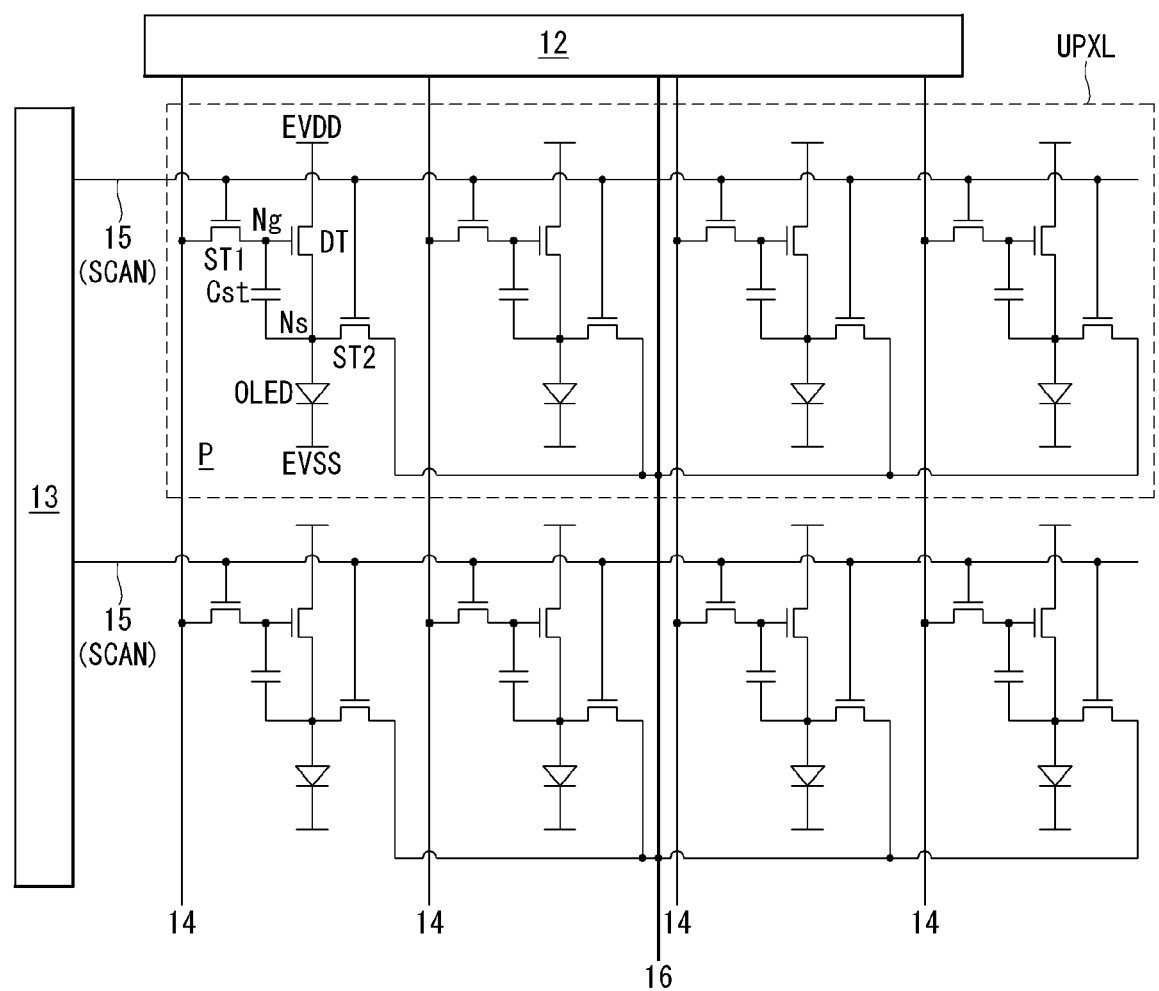
FIG. 3 shows the connecting configuration of the pixels constituting the pixel array according to an embodiment of the present disclosure.
Figure 4:
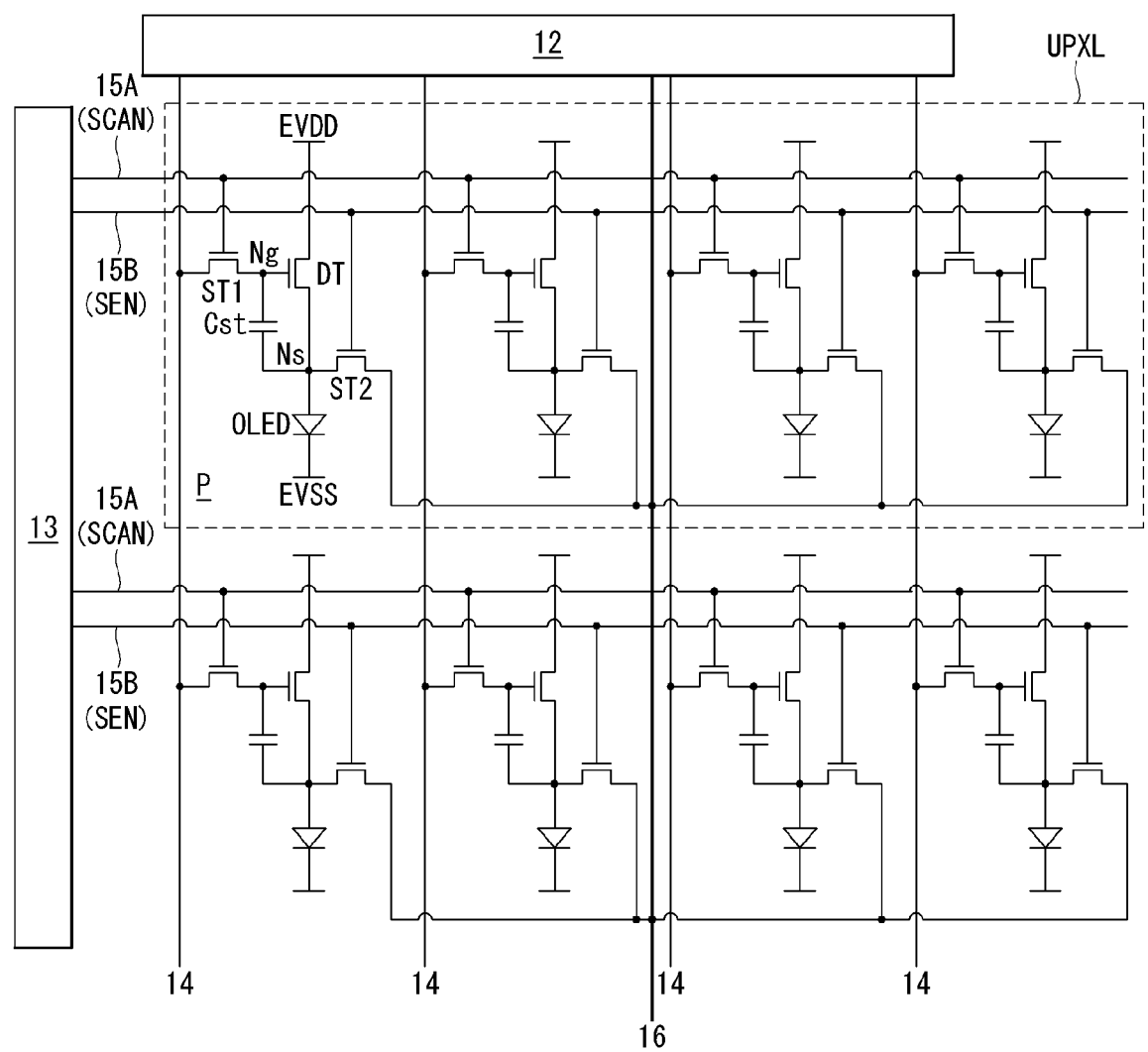
FIG. 4 shows another connecting configuration of the pixels constituting the pixel array according to an embodiment of the present disclosure.

FIG. 1 shows a block diagram illustrating an organic light emitting display device according to an embodiment of the present disclosure, FIG. 2 shows the connecting configuration of the data driving circuit including the current sensing device of the present disclosure and a pixel array, and FIGS. 3 and 4 show various connecting configurations of the pixels constituting the pixel array.

Referring to FIGS. 1 to 4, the organic light emitting display device according to the embodiment of the present disclosure may comprise a display panel 10, a timing controller 11, a data driving circuit 12, and a gate driving circuit 13. The data driving circuit 12 includes a current sensing circuit 122 according to an embodiment of the present disclosure.

A plurality of data lines 14 and sensing lines 16 and a plurality of gate lines 15 cross each other on the display panel 10, and the pixels for sensing P are arranged in a matrix form to form a pixel array. As shown in FIG. 4, the plurality of gate lines 15 may comprise a plurality of first gate lines 15A to which scan control signals SCAN are supplied and a plurality of second gate lines 15B to which sense control signals SEN are supplied. When the scan control signal SCAN and the sense control signals SEN are of a same phase to each other, the first and second gate lines 15A and 15B may be unified into one gate line 15 as shown in FIG. 3.

Each pixel P may be connected to one of the data lines 14, one of the sensing lines 16, and one of the gate lines 15. The pixels P constituting the pixel array may comprise the red pixels for displaying red color, the green pixels for displaying green color, the blue pixels for displaying blue color, and the white pixels for displaying white color. Four pixels including the red pixel, the green pixel, the blue pixel, and the white pixel may constitute one pixel unit UPXL. But, the configuration of the pixel unit UPXL is limited thereto. The plurality of pixels P constituting a same pixel unit UPXL may share one sensing line 16. Although not shown in the figure, a plurality of pixels P constituting the same pixel unit UPXL may be independently connected to different sensing lines. Each pixel P receives a high power voltage EVDD and a low power voltage EVSS from a power generator.

As shown in FIGS. 3 and 4, the pixel according to the present disclosure may comprise an OLED, a driving TFT DT, a storage capacitor Cst, a first switch TFT ST1, and a second switch TFT ST2, but is not limited thereto. The TFTs may be implemented of a P-type, an N-type or a hybrid-type in which the P-type and the N-type are mixed. The semiconductor layer of the TFT may include amorphous silicon, polysilicon, or an oxide.

The OLED is a light-emitting element. The OLED may include an anode electrode connected to a source node Ns, a cathode electrode connected to an input terminal of a low power voltage EVSS, and an organic compound layer disposed between the anode electrode and the cathode electrode. The organic compound layer may include a hole injection layer HIL, a hole transport layer HTL, an emission layer EML, an electron transport layer ETL, and an electron injection layer EIL.

The driving TFT DT controls the magnitude of the current flowing from a source electrode to a drain electrode to be input to the OLED according to the voltage difference Vgs between a gate electrode and the source electrode. The driving TFT DT comprises the gate electrode connected to a gate node Ng, the drain electrode connected to the input terminal of the high power voltage EVDD and the source electrode connected to a source node Ns. The storage capacitor Cst is connected between the gate node Ng and the source node Ns to hold the voltage Vgs between the gate and source electrodes of the driving TFT DT for a period of time. The first switch TFT ST1 switches the electric connection between the data line 14 and the gate node Ng according to the scan control signal SCAN. The first switch TFT ST1 comprises a gate electrode connected to the first gate line 15A, a first electrode connected to the data line 14 and a second electrode connected to the gate node Ng. The second switch TFT ST2 switches the electric connection between the sensing line 16 and the source node Ns according to the sense control signal SEN. The second switch TFT ST2 is equipped with a gate electrode connected to the second gate line 15B, a first electrode connected to the sensing line 16 and a second electrode connected to the source node Ns.

The first gate line 15A and the second gate line 15B may be unified into one gate line 15 (refer to FIG. 3). In this case, the scan control signal SCAN and the sense control signal SEN may have a same phase.

The organic light emitting display device having this pixel array adopts an external compensation method. The external compensation method senses the driving characteristics of the organic light emitting diode OLED and/or the driving TFT, and compensates for input image data according to sensed values. The driving characteristics of the OLED means the operating point voltage of the OLED. The driving characteristics of the driving TFT include a threshold voltage and electron mobility of the driving TFT.

The organic light emitting display device of the present disclosure performs an image displaying operation and an external compensating operation. The external compensating operation may be performed in a vertical blank interval during the image displaying operation, in a power on sequence before image display starts or in a power off sequence after the image display ends. The vertical blank interval is a period in which image data is not written, and disposed between vertical active intervals in which image data is written. The power on sequence means the period until image is displayed immediately after driving power is applied. The power off sequence means the period until the driving power is turned off immediately after the image display is terminated.

The timing controller 11 generates the data control signals DDC for controlling the operating timings of the data driving circuit 12 and the gate control signals GDC for controlling the operating timings of the gate driving circuit 13, based on the timing signals including a vertical synchronization signal Vsync, a horizontal synchronization signal Hsync, a dot clock signal DCLK, a data enable signal DE, and the like. The timing controller 11 may temporally separate a period during which the image displaying operation is performed and a period during which the external compensating operation is performed and generate the control signals DDC and GDC for the image displaying operation and the control signals DDC and GDC for the external compensating operation.

The gate control signals GDC may include a gate start pulse GSP, a gate shift clock GSC, and so on. The gate start pulse GSP is applied to the gate stage of generating a first scan signal to control the gate stage to generate the first scan signal. The gate shift clock GSC is commonly supplied to the gate stages to shift the gate start pulse GSP.

The data control signals DDC includes a source start pulse SSP, a source sampling clock SSC, a source output enable signal SOE, and so on. The source start pulse SSP controls a data sampling start timing of the data driving circuit 12. The source sampling clock SSC controls a sampling timing of data in respective source drive ICs, based on a rising or falling edge. The source output enable signal SOE controls an output timing of the data driving circuit 12. The data control signals DDC may further include various signals for controlling the operation of the current sensing device 122 included in the data driving circuit 12.

The timing controller 11 receives digital sensing values SD according to the external compensating operation from the data driving circuit 12. The timing controller 11 may correct input image data DATA based on the digital sensing values SD to compensate for the deteriorating deviation of the driving TFT or the OLED among pixels. The timing controller 11 transmits the corrected digital image data DATA to the data driving circuit 12 in the period for image display.

The data driving circuit 12 may comprise at least one source driver integrated circuit (IC). The source driver IC may comprise a latch array (not shown), a plurality of digital-analog converters DAC 121 connected to the data lines 14 and a current sensing device 122 connected to each sensing line 16 through a sensing channel. The current sensing device 122 includes a plurality of sensing units SU.

The latch array latches the digital image data DATA input from the timing controller 11 and supplies it to the DAC, based on the data control signals DDC. The DAC converts the digital image data DATA input from the timing controller 11 into the data voltage for displaying and supplies it to the data lines 14 when performing the image displaying operation. The DAC may generate the data voltage for sensing at a certain level and supply it to the data lines 14 when performing the external compensating operation.

By implementing each of the sensing units SUs as a single-slope analog to digital converter ADC, the mounting area for the sensing units SUs may be reduced in the data driving circuit 12. The single-slope ADC is a combination of a first configuration for changing a current to a voltage and a second configuration for changing an analog voltage to a digital value. It is advantageous to reduce noise and the mounting area as compared with the prior art in which the first and second configurations are independent.

Each of the sensing units SU serves to convert the pixel current input through a sensing channel into a digital sensing value SD. Each sensing unit SU does not adopt a conventional current integrator, but adopt the single-slope ADC which detects the pixel current and converts it into a digital signal by comparing it with a reference current, thereby reducing the noise and non-linearity occurring in the process of converting a current into a voltage. In other words, since each sensing unit SU employs an I-V converter without a feedback capacitor instead of a current integrator with a feedback capacitor, the problem that the sensing unit operates as a noise amplifier may be prevented in advance. The sensing units SU constituting the current sensing device will be described later in detail with reference to FIG. 5 to FIG. 15.

The gate driving circuit 13 generates the scan control signals SCAN based on the gate control signal GDC to match the image display operation and the external compensation operation and then supplies them to the first gate lines 15A. Also, the gate driving circuit 13 generates the sense control signals SEN based on the gate control signal GDC to match the image display operation and the external compensation operation and then supplies them to the second gate lines 15B. Or, the gate driving circuit 13 may generate the scan control signals SCAN and the sense control signals SEN of a same phase based on the gate control signal GDC to match the image display operation and the external compensation operation and then supplies them to the gate lines 15.

Figure 5:
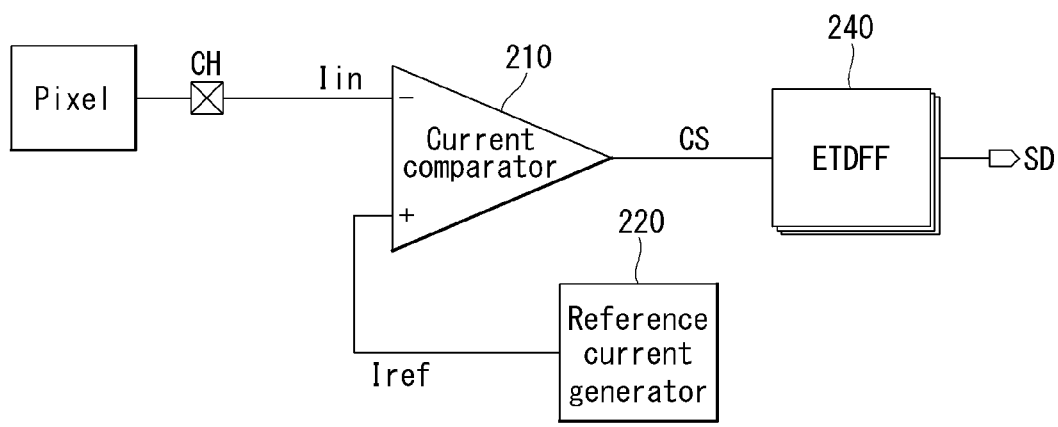
FIG. 5 shows the configuration of the sensing unit for implementing the current sensing device according to an embodiment of the present disclosure.
Figure 6:
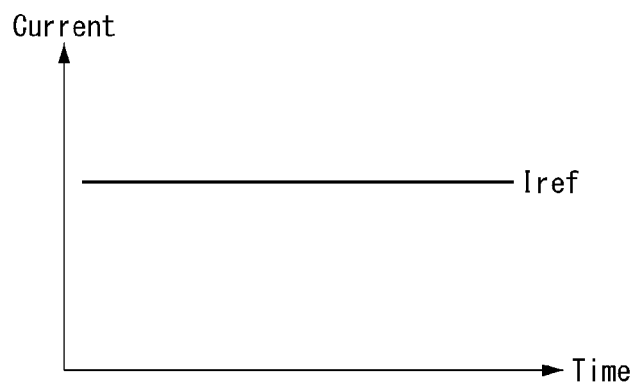
FIG. 6 shows a reference current output from a reference current generator of FIG. 5.

FIG. 5 shows the configuration of the sensing unit for implementing the current sensing device according to the present disclosure, and FIG. 6 shows a reference current output from a reference current generator of FIG. 5.

Referring to FIG. 5, the sensing unit SU constituting the current sensing device of the present disclosure comprises a reference current generator 220, a current comparator 210 and an edge triggered data flip-flop ETDFF 240, in order to implement the single-slope ADC.

The reference current generator 220 generates a reference current Iref having a constant level as shown in FIG. 6.

The current comparator 210 outputs a comparator output signal CS based on the pixel current Iin input through a sensing channel CH and the reference current Iref input from the reference current generator 220. Especially, the current comparator 210 eliminates an offset deviation component included in both of the pixel current Iin and the reference current Iref by using a reset current externally applied, thereby reducing the sensing result distortion owing to an offset error. The specific configuration of the current comparator 210 will be described in detail with reference to FIG. 10 to FIG. 15.

The edge triggered data flip-flop 240 outputs a digital sensing value SD corresponding to the pixel current Iin based on the comparator output signal CS. The edge triggered data flip-flop 240 differently outputs the digital sensing value SD corresponding to the pixel current Iin according to a logic value of the comparator output signal CS.

Figure 7:
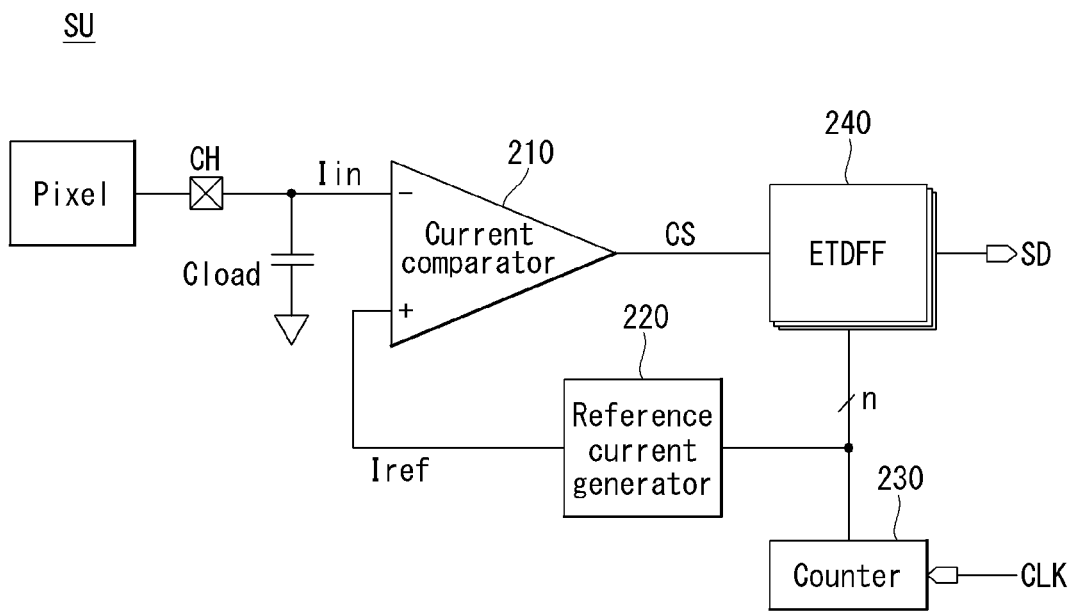
FIG. 7 shows the configuration of another sensing unit for implementing the current sensing device according to the present disclosure.
Figure 8:
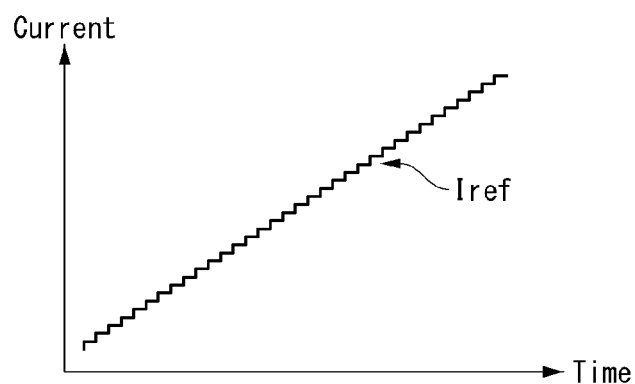
FIG. 8 shows a reference current output from a reference current generator of FIG. 7.
Figure 9:
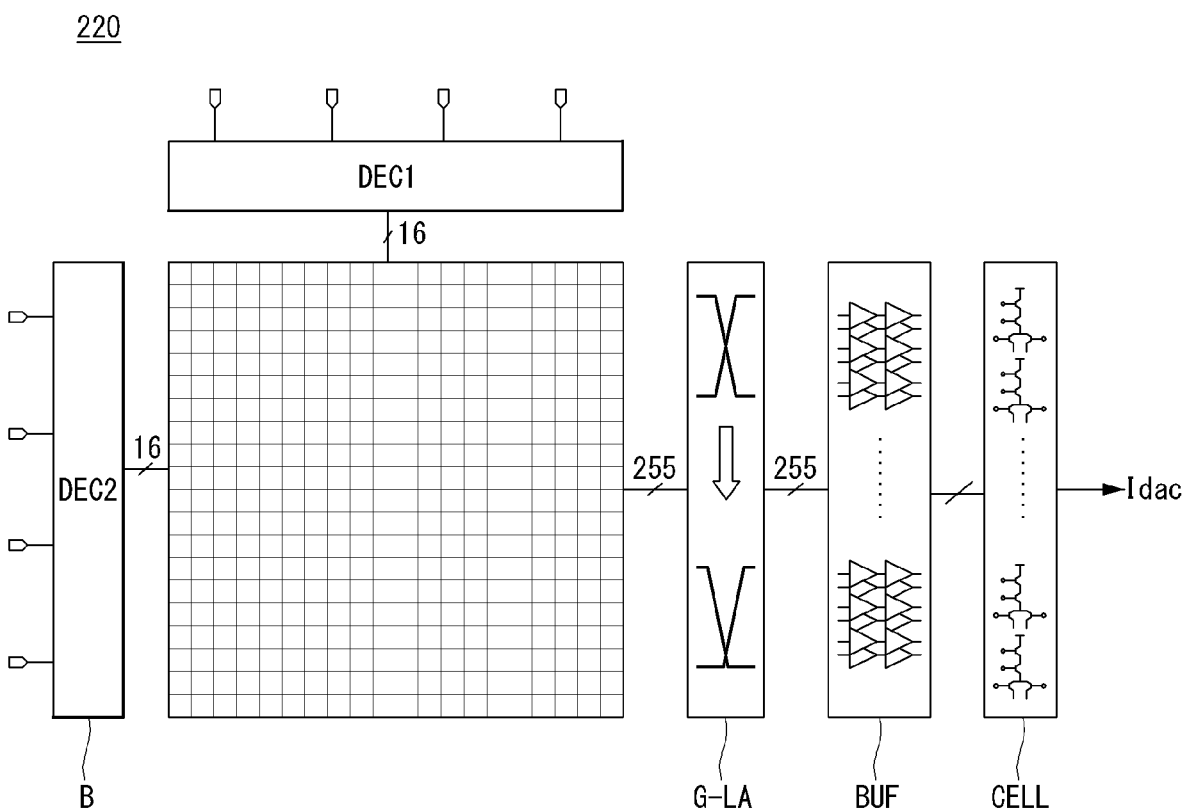
FIG. 9 shows a configuration of the reference current generator of FIG. 7 according to an embodiment of the present disclosure.

FIG. 7 shows the configuration of another sensing unit for implementing the current sensing device according to the present disclosure, FIG. 8 shows a reference current output from a reference current generator of FIG. 7, and FIG. 9 shows a configuration of the reference current generator of FIG. 7.

Referring to FIG. 7, another sensing unit SU constituting the current sensing device of the present disclosure comprises the reference current generator 220, the current comparator 210, and the edge triggered data flip-flop ETDFF 240, in order to implement the single-slope ADC, and further comprises a counter 230.

The reference current generator 220 generates a ramp current Idac increasing at a constant slope as shown in FIG. 8. The reference current generator 220 may be implemented as a thermometer type or a binary type. The thermometer type is large in logic size but easy to reduce glitches. Conversely, the binary type has a small logic size but a large glitch. Since the glitch is directly related to a sensing performance, it is more preferable to configure the DAC 220 of a current-driven type in the thermometer type.

As shown in FIG. 9, the reference current generator 220 of the thermometer type comprises a logic circuit unit of 2K bits (K is an integer) and current cells CELL generating an analog ramp current responding to the digital code value output from the logic circuit unit. The logic circuit unit is constituted by a logic combination of a first decoder DEC1 of K bits (for example, 4 bits) and a second decoder DEC2 of K bits. The current cells CELL may comprise a plurality of MOS switches. A giga latch G-LA and a digital buffer BUF may be connected between the logic circuit unit and the current cells CELL. The giga latch G-LA improves the operational stability of the MOS switches constituting the current cells CELL and reduces the glitch. To this end, the giga latch G-LA may adjust a polling time and a rising time of the control signal for controlling the switching operations of the MOS switches. The digital buffer BUF stabilizes the control signal whose polling timing and rising timing are adjusted, and supplies the stabilized control signal to the current cells CELL. The analog lamp current Iref generated in the current cells CELL may have a sawtooth waveform that increases at a constant slope as shown in FIG. 8.

The current comparator 210 outputs a comparator output signal CS based on the pixel current Iin input through a sensing channel CH and the reference current Iref input from the reference current generator 220. Especially, the current comparator 210 eliminates an offset deviation component included in both of the pixel current Iin and the reference current Iref by using a reset current externally applied, thereby minimizing the sensing result distortion owing to an offset error. The specific configuration of the current comparator 210 will be described in detail with reference to FIG. 10 to FIG. 15.

The counter 230 successively generates count information of n bits (n is an integer) and supplies it to the edge triggered data flip-flop 240.

The edge triggered data flip-flop 240 receives the comparator output signal CS from the current comparator 210 as well as the count information of n bits from the counter 230. The edge triggered data flip-flop 240 outputs the count information synchronized with a logic inversion timing of the comparator output signal CS (that is, the timing at which the comparator output signal inverts from low level to high level) as a digital sensing value SD corresponding to the pixel current Iin.

Figure 10:
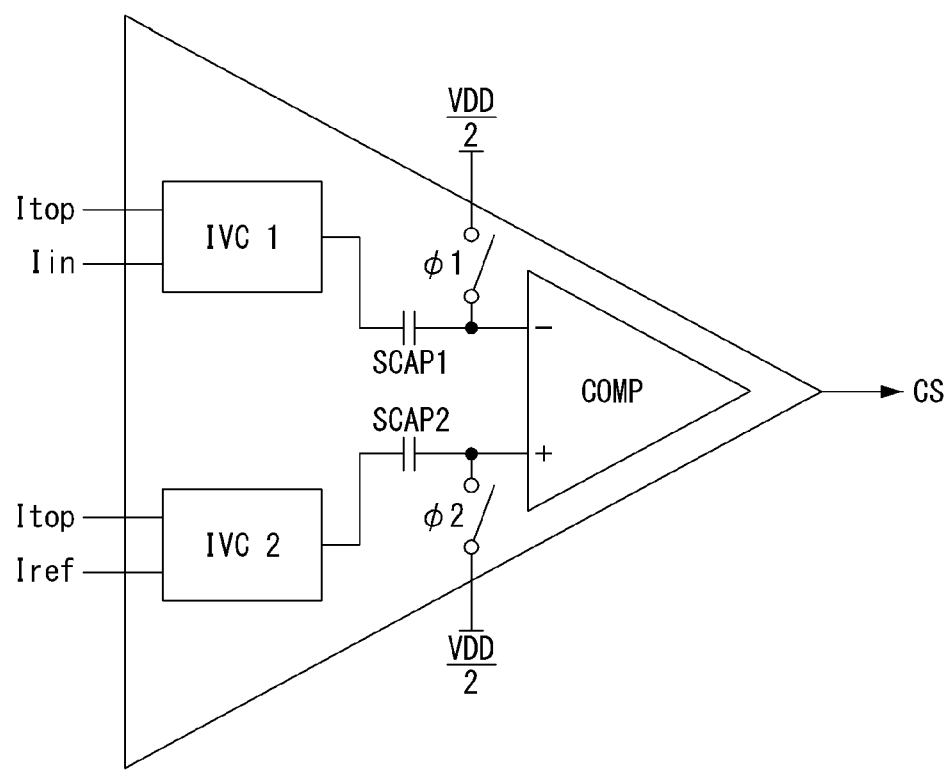
FIG. 10 shows a configuration of the current comparator included in FIG. 5 and FIG. 7 according to an embodiment of the present disclosure.
Figure 11:
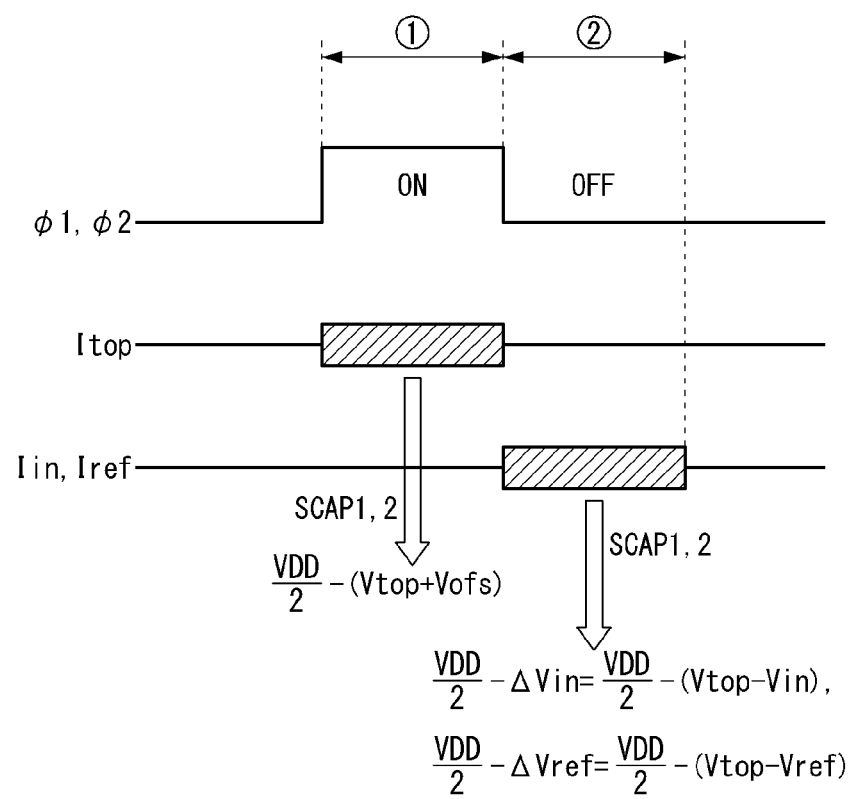
FIG. 11 is a diagram for explaining a method of eliminating offset errors of the I-V converters in the current comparator of FIG. 10 according to an embodiment of the present disclosure.
Figure 12:
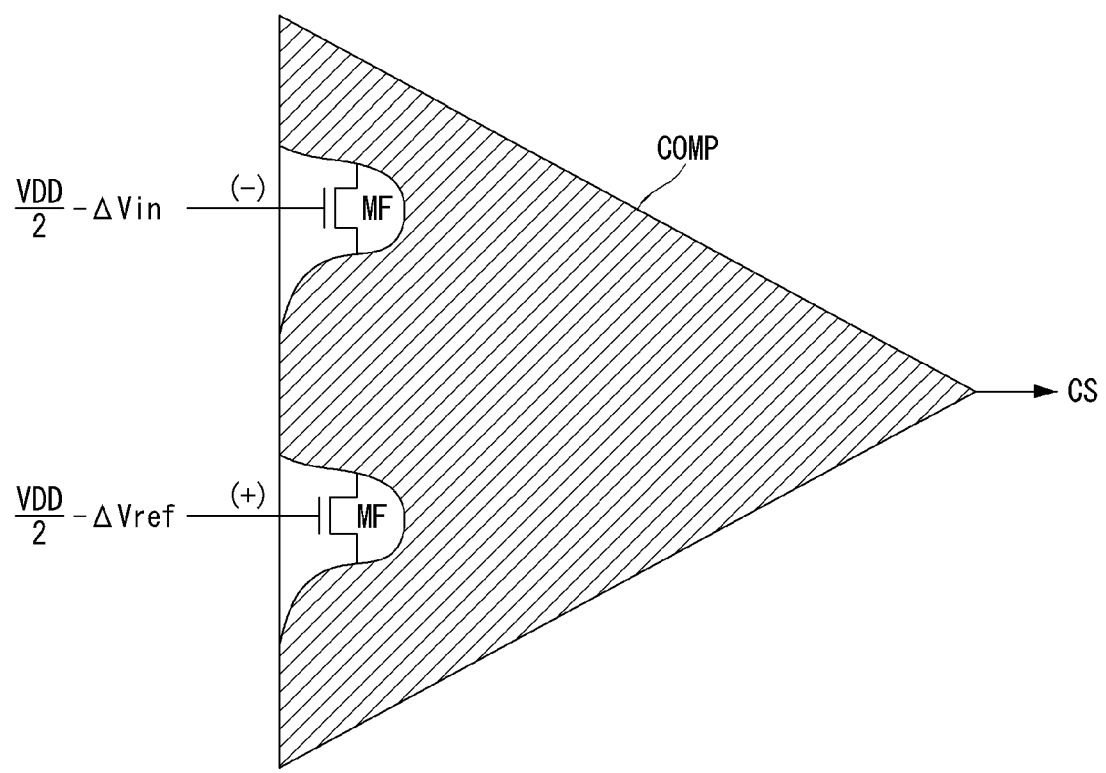
FIG. 12 shows that current paths are cut off at the output terminals of the first and second I-V converters included in the current comparator of FIG. 10 according to an embodiment of the present disclosure.

FIG. 10 shows a configuration of the current comparator included in FIG. 5 and FIG. 7, FIG. 11 is a diagram for explaining a method of eliminating offset errors of the I-V converters in the current comparator of FIG. 10, and FIG. 12 shows that current paths are cut off at the output terminals of the first and second I-V converters included in the current comparator of FIG. 10.

Referring to FIGS. 10 and 11, the current comparator 210 outputs the comparator output signal CS based on the pixel current Iin input through a sensing channel CH and the reference current Iief input from the reference current generator 220, and eliminates an offset deviation component included in both of the pixel current Iin and the reference current Iref by using a reset current Itop externally applied.

To this end, the current comparator 210 comprises a first current-voltage converter IVC 1 (hereinafter referred as a first I-V converter), a second current-voltage converter IVC 2 (hereinafter refereed as a second I-V converter), a first sampling capacitor SCAP1, a second sampling capacitor SCAP2, and a comparing unit COMP.

The first I-V converter IVC 1 converts the pixel current Iin into a pixel voltage Vin and converts the reset current Itop into a reset voltage Vtop. The configuration and operation of the first I-V converter IVC 1 will be described later with reference to FIGS. 13 to 14C.

The second I-V converter IVC 2 converts the reference current Iief into a reference voltage Vref and converts the reset current Itop into a reset voltage Vtop. The configuration and operation of the second I-V converter IVC 2 will be described later with reference to FIGS. 13 to 14C.

The first sampling capacitor SCAP1 stores a first correlated double sampling value ([VDD/2]−ΔVin) free from an offset deviation component Vofs by double-sampling the pixel voltage Vin and the reset voltage Vtop. One electrode of the first sampling capacitor SCAP1 is connected to an output terminal of the first I-V converter IVC1 and the other electrode of the first sampling capacitor SCAP1 is connected to an inverting input terminal (−) of the comparing unit COMP.

The second sampling capacitor SCAP2 stores a second correlated double sampling value ([VDD/2]−ΔVref) free from an offset deviation component Vofs by double-sampling the reference voltage Vref and the reset voltage Vtop. One electrode of the second sampling capacitor SCAP2 is connected to an output terminal of the second I-V converter IVC 2 and the other electrode of the second sampling capacitor SCAP2 is connected to a non-inverting input terminal (−) of the comparing unit COMP.

The comparing unit COMP compares the first correlated double sampling value ([VDD/2]−ΔVin) with the second correlated double sampling value ([VDD/2]−ΔVref) to generate the comparator output signal CS.

The current comparator may further comprise a driving voltage input terminal to which a driving voltage VDD/2 is supplied, a first sampling switch Φ1 and a second sampling switch Φ2.

The first sampling switch Φ1 turns on or off a current flow between the other electrode of the first sampling capacitor SCAP1 and the driving voltage input terminal. The second sampling switch Φ2 turns on or off a current flow between the other electrode of the second sampling capacitor SCAP2 and the driving voltage input terminal.

A process of implementing a correlated double sampling operation in the current comparator 210 will be described with reference to FIG. 11.

In the section ①, the first and second sampling switches Φ1 and Φ2 maintain a turn-on state, and the first and second I-V converters IVC 1 and IVC 2 convert the reset current Itop into the reset voltage Vtop. In the section ①, the offset voltage Vofs and the reset voltage Vtop of the first I-V converter IVC1 are applied to the one electrode of the first sampling capacitor SCAP1, and the driving voltage VDD/2 is applied to the other electrode of the first sampling capacitor SCAP1. And, in the section ①, the offset voltage Vofs and the reset voltage Vtop of the second I-V converter IVC 2 are applied to the one electrode of the second sampling capacitor SCAP2, and the driving voltage VDD/2 is applied to the other electrode of the second sampling capacitor SCAP2. As a result, a first sampling result value, that is (VDD/2−(Vtop+Vofs)) is stored in respective of the first and second sampling capacitor SCAP1 and SCAP2.

In the section ②, the first and second sampling switches Φ1 and Φ2 maintain a turn-off state, the first I-V converter IVC 1 converts the pixel current Iin into the pixel voltage Vin, and the second I-V converter IVC 2 converts the reference current Iref into the reference voltage Vref. In the section ②, the offset voltage Vofs and the pixel voltage Vin of the first I-V converter IVC 1 are applied to the one electrode of the first sampling capacitor SCAP1, and the offset voltage Vofs and the reference voltage Vref of the second I-V converter IVC 2 are applied to the one electrode of the second sampling capacitor SCAP2. As a result, the first sampling capacitor SCAP1 stores a second sampling result value, that is the first correlated double sampling value (VDD/2−ΔVin) free from the offset voltage Vofs of the first I-V converter IVC 1. Also, the second sampling capacitor SCAP2 stores a second sampling result value, that is the second correlated double sampling value (VDD/2−ΔVref) free from the offset voltage Vofs of the second I-V converter IVC2.

Thus, the offset voltages Vofs of the first and second I-V converters IVC 1 and IVC 2 are removed by the sampling operations of two times. Since the first correlated double sampling value (VDD/2−ΔVin) and the second correlated double sampling value (VDD/2−ΔVref) do not include the offset voltages Vofs of the first and second I-V converters IVC 1 and IVC 2, the comparing unit COMP may compare pure voltages Vin and Vref for pure currents Iin and Iref. So, the sensing result distortion due to the offset error may be minimized.

As shown in FIG. 12, the comparing unit COMP may have a known OP-AMP open loop structure which includes a MOS switch MF connected to an inverting terminal (−) and a MOS switch MF connected to a non-inverting terminal (+). The comparing unit COMP generates the comparator output signal CS by comparing the first correlated double sampling value ([VDD/2]−ΔVin) applied to a gate terminal of the MOS switch MF connected to the inverting input terminal (−) with the second correlated double sampling value ([VDD/2]−ΔVref) applied to a gate terminal of the MOS switch MF connected to the non-inverting input terminal (+).

At this time, the comparing unit COMP may output the comparator output signal CS as a first logic value when the first correlated double sampling value ([VDD/2]−ΔVin) is smaller than the second correlated double sampling value ([VDD/2]−ΔVref), output the comparator output signal CS as a second logic value when the first correlated double sampling value ([VDD/2]−ΔVin) is equal to the second correlated double sampling value ([VDD/2]−ΔVref), and output the comparator output signal CS as a third logic value when the first correlated double sampling value (VDD/2−ΔVin) is larger than the second correlated double sampling value ([VDD/2]−ΔVref). Then, the edge triggered data flip-flop ETDFF may differently output a digital sensing value SD corresponding to the pixel current Iin depending on the first logic value, the second logic value, and the third logic value.

Meanwhile, the edge triggered data flip-flop ETDFF may invert a logic value of the comparator output signal CS at the instant when the first correlated double sampling value (VDD/2−Vin) becomes greater than the second correlated double sampling value (VDD/2−Vref), and output count information synchronized with the logic inverting timing of the comparator output signal CS as a digital sensing value SD corresponding to the pixel current Iin.

Figure 13:
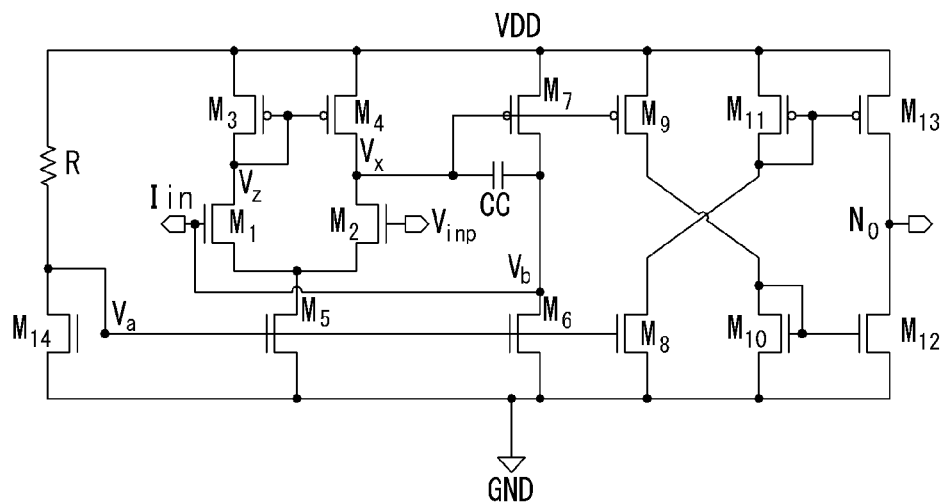
FIG. 13 shows a circuit configuration of first and second I-V converters included in the current comparator of FIG. 10 according to an embodiment of the present disclosure.

FIG. 13 shows a circuit configuration of first and second I-V converters included in the current comparator of FIG. 10, and FIGS. 14A to 14C are diagrams for explaining the operation of the I-V converter of FIG. 13.

Referring to FIG. 13, the first I-V converter IVC 1 includes a plurality of MOS switches M1 to M14 connected between a high potential power voltage VDD and a base power voltage GND, and a compensating capacitor CC. The compensating capacitor CC suppresses an oscillation of a drain terminal voltage of M6. On the other hand, the second I-V converter IVC 2 is substantially same as the first I-V converter IVC 1 except that the reference current Iief is input instead of the pixel current Iin. For convenience of explanation, the first I-V converter IVC1 will be mainly described below.

In the first I-V converter IVC 1, some MOS switches M1 to M7 have an OP-AMP closed loop structure XY. So, a gate terminal of M1 is connected to a drain terminal of M6, and a drain terminal voltage of M6 is fixed to an input voltage Vinp applied to a gate terminal of M2. The pixel current In is applied to a gate terminal of M1. M13 is connected between the high potential power voltage VDD and an output node No, M12 is connected between the output node No and the base power voltage GND.

The principle which a voltage Vout of the output node No, that is the pixel voltage Vin, increases by an increase of the pixel current Iin will be described as follows.

Figure 14A:
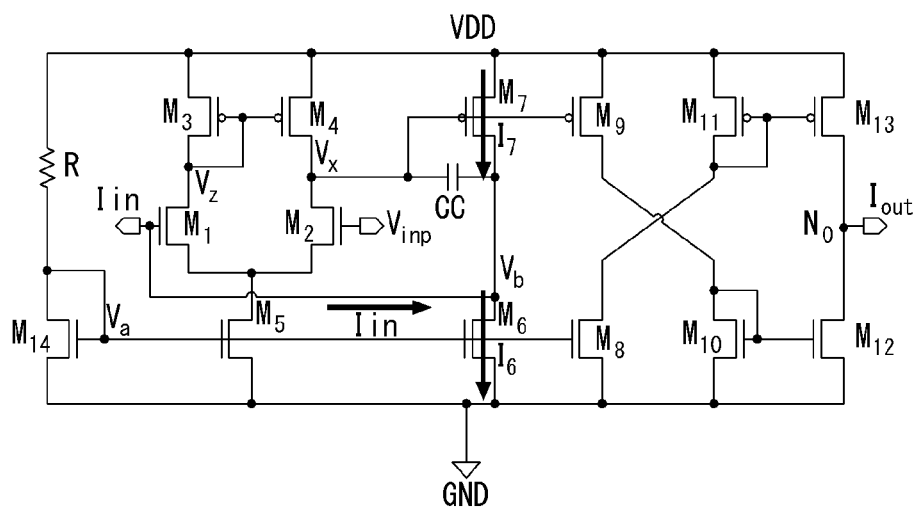
FIGS. 14A to 14C are diagrams for explaining the operation of the I-V converter of FIG. 13 according to an embodiment of the present disclosure.

Referring to FIG. 14A, M6 is connected between an input terminal of the pixel current IM and the base power voltage GND, and M7 is connected between the high potential power voltage VDD and the input terminal of the pixel current Iin. Since a drain terminal voltage Vb of M6 is fixed to an input voltage Vinp by the OP-AMP closed loop structure XY, a current I6 flowing though M6 is fixed and a value of the current I6 is same as a sum of the pixel current In and a current I7 flowing through M7. Thus, the current I6 flowing through M6 is fixed, so the current I7 flowing through M7 decreases when the pixel current Iin increases.

In order for the current I7 flowing through M7 to decrease, a voltage Vx applied to a gate terminal of M7 must be increased. A current flowing through M9 and M10 decrease by the increased voltage Vx, and as a result a current I12 flowing through M12 decreases.

Figure 14B:
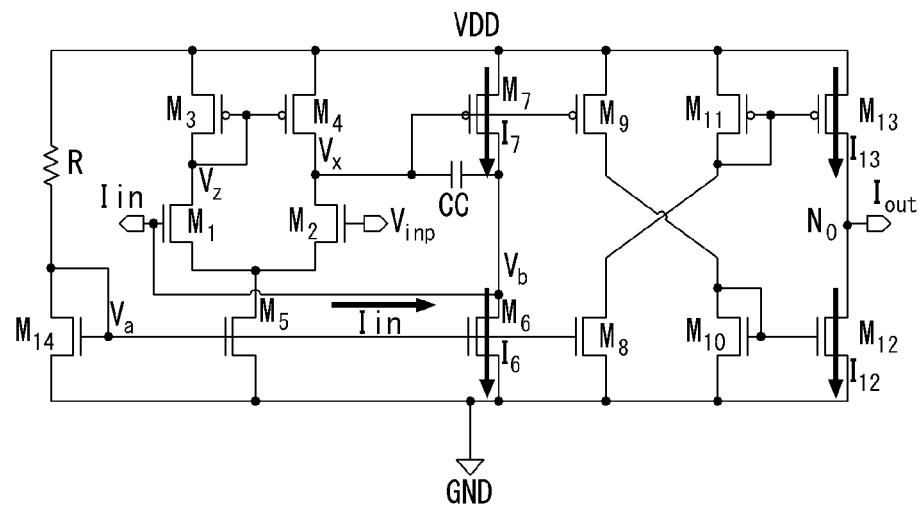
Figure 14C:
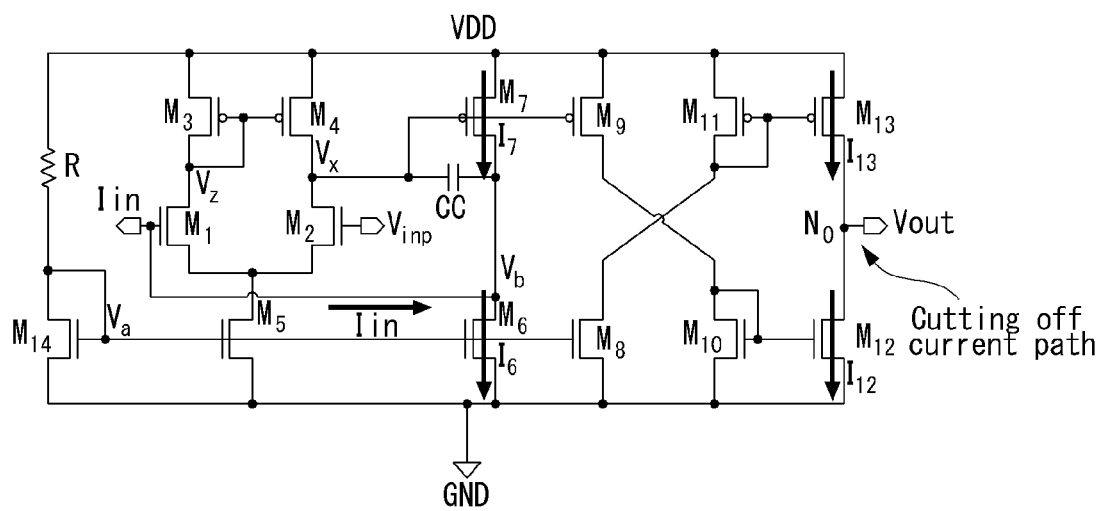

Referring to FIG. 14B, since a current I13 flowing through M13 is mirrored from M11, the current I13 flowing through M13 is constant irrespective of an increase of the pixel current Iin. A current Iout of the output node No is equal to a value obtained by subtracting a current I12 flowing through M12 from a current I13 flowing through M13. At this time, the current I12 flowing through M12 decreases while the current I13 flowing through M13 is constant, so that the current Iout of the output node No increases.

In this state, if a path of the current Iout in the output node No is cut off (referring to FIG. 12, the output node No is connected to the gate terminal of the MOS switch MF connected to the non-inverting terminal (−) of the comparing unit COMP), a voltage change appears at the output node No. At this time, the voltage Vout of the output node No becomes a value obtained by subtracting I12*r13 from the high potential power voltage VDD and the value comes to increase. Here, r13 indicates a channel resistance of M13.

According to a principle similar to this, the voltage Vout of the output node No decreases in case that the pixel current Iin decreases.

Figure 15:
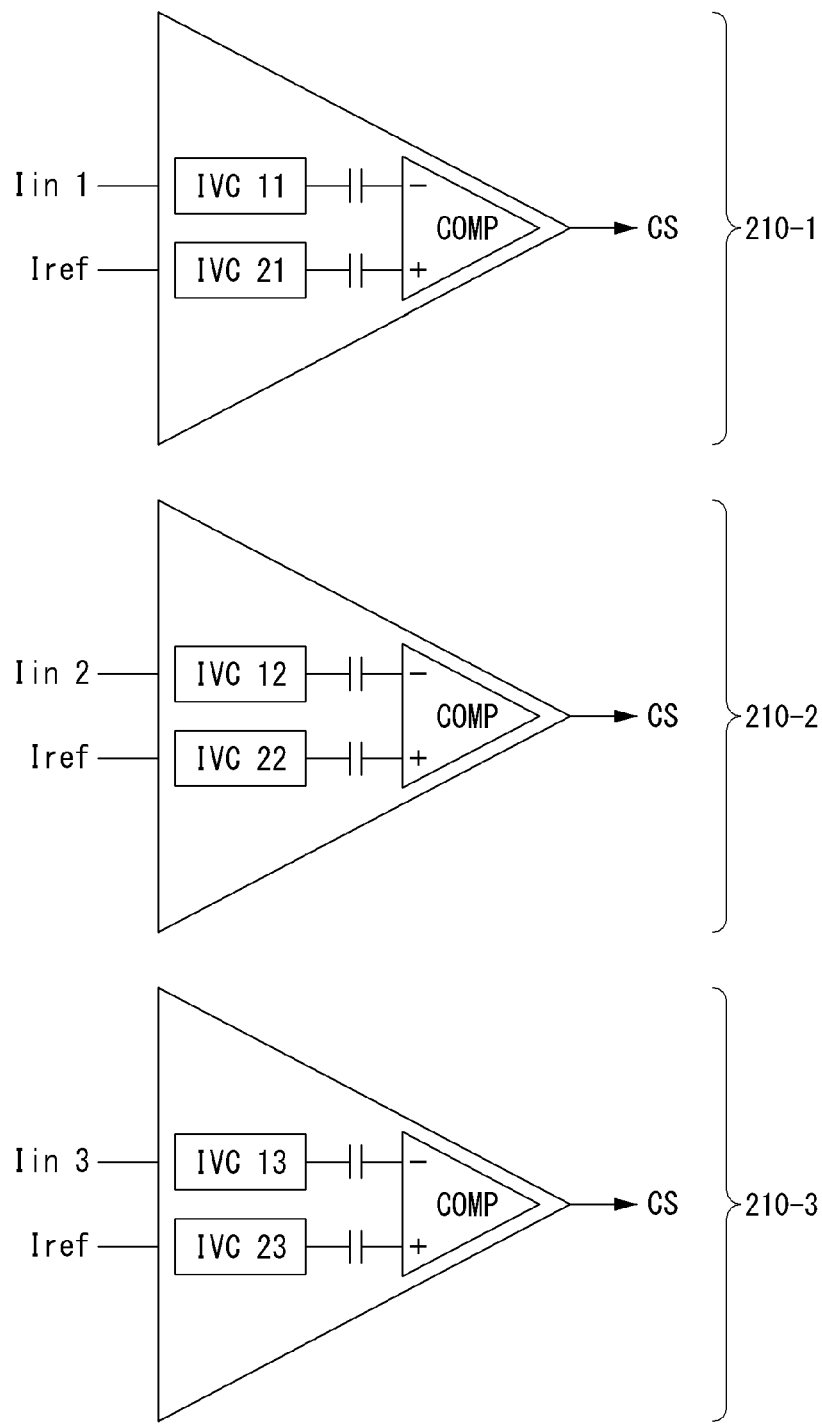
FIG. 15 is a diagram showing that a plurality of current comparators, each including a different first I-V converter, are provided with different second I-V converters individually according to an embodiment of the present disclosure.

FIG. 15 is a diagram showing that a plurality of current comparators, each including a different first I-V converter, are provided with different second I-V converters individually.

Referring to FIG. 15, a plurality of current comparators each of which includes one of different first I-V converters IVC 11 to IVC 13 may be provided with different second I-V converters IVC 21 to IVC 23 individually. In this case, a same reference current Iref must be input to the plurality of current comparators 210-1, 210-2, and 210-3 in order to improve comparison performance. However, unlike an ideal environment, the current comparators 210-1, 210-2, and 210-3 cannot receive a same reference current Iief due to differences in resistance component of the conductive lines supplying the reference current Iref in actual circuits.

Figure 16:
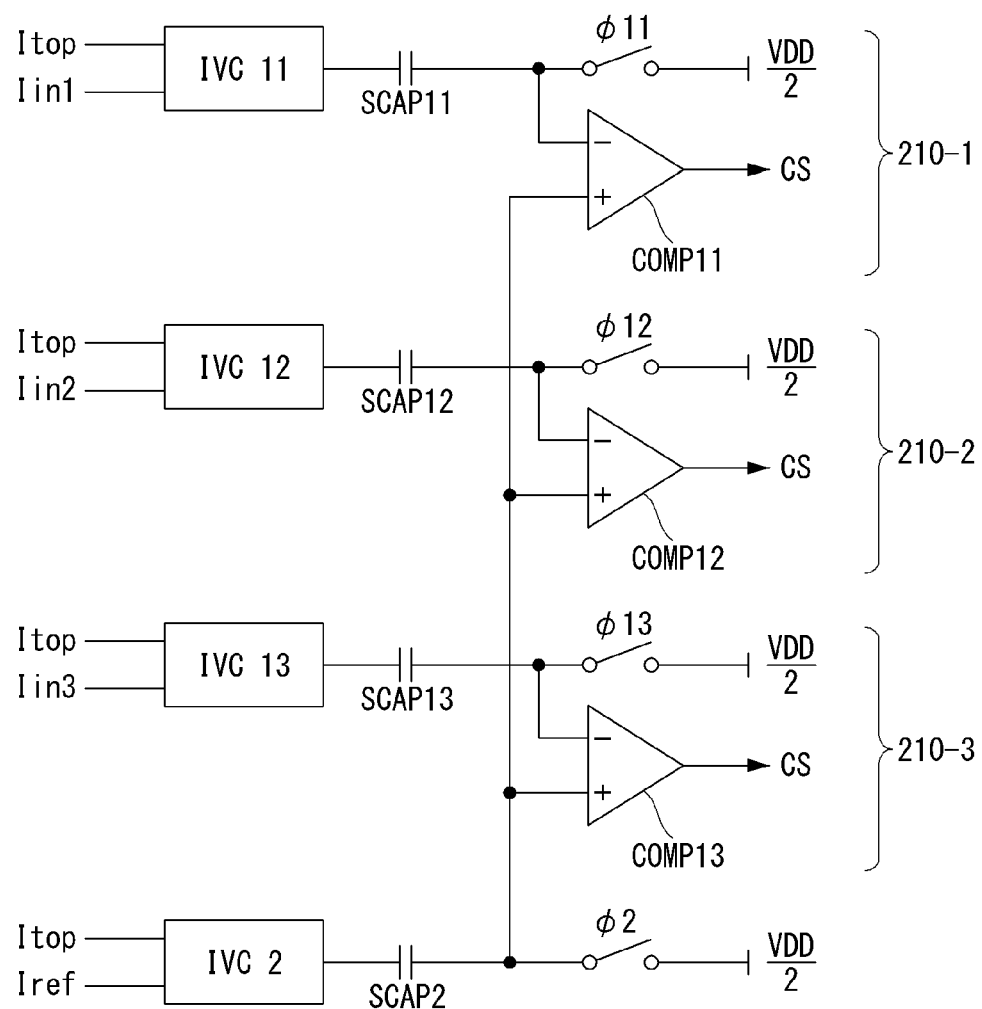
FIG. 16 is a diagram showing that a plurality of current comparators, each including a different first I-V converter, share a same second I-V converter according to an embodiment of the present disclosure.

FIG. 16 is a diagram showing that a plurality of current comparators, each including a different first I-V converter, share a same second I-V converter.

For the same reason as in FIG. 15, a same reference current Iref must be input to the current comparators 210-1, 210-2, and 210-3 of FIG. 16. To this end, a plurality of current comparators IVC 11 to IVC 13 each of which includes one of different first I-V converters IVC 11 to IVC 13 may share a same second I-V converter IVC 2. As shown in FIG. 16, in the plurality of current comparators 210-1, 210-2 and 210-3, the comparison performance may be significantly improved as compared to FIG. 15 if the second correlated double sampling value of the same second IV converter IVC2 is compared with the first correlated double sampling values of the different first IV converters IVC11 to IVC13.

As described above, the present disclosure implements the sensing unit by the single-slope ADC without a feedback capacitor while not implementing the sensing unit with a current integrator having the feedback capacitor, thereby preventing the problem that the sensing unit operates as a noise amplifier. Accordingly, the present disclosure may reduce a noise input, thereby greatly enhancing sensing performance and compensation performance.

Further, by adding a configuration capable of correlated double sampling to the current comparator of respective sensing units, and by removing the offset deviation components contained in both of the pixel current and the reference current using the reset current externally applied, the distortion resulting from the sensing error due to the offset error may be minimized.

Furthermore, the present disclosure designs such that at least two or more of sensing units share a same second current-voltage converter. If the second correlated double sampling value of the same second current voltage converter is compared with the first correlated double sampling values of the different first current voltage converters in a plurality of current comparators, the comparison performance may be significantly improved.

Throughout the description, it should be understood by those skilled in the art that various changes and modifications are possible without departing from the technical principles of the present disclosure. Therefore, the technical scope of the present disclosure is not limited to the detailed descriptions in this specification but should be defined by the scope of the appended claims.

What is claimed is:
1. A current sensing device, comprising:
  a plurality of sensing units each of which is connected to different sensing channels, wherein each of the plurality of sensing units comprises:
  a reference current generator configured to generate a reference current;
  a current comparator configured to output a comparator output signal based on a pixel current input through any one of the sensing channels and the reference current, and to remove an offset deviation component included in the pixel current and the reference current by using a reset current externally applied; and an edge triggered data flip-flop configured to output a digital sensing value corresponding to the pixel current based on the comparator output signal, wherein the current comparator comprises:

a first current-voltage converter configured to convert the pixel current into a pixel voltage and to convert the reset current into a reset voltage;

a second current-voltage converter configured to convert the reference current into a reference voltage and to convert the reset current into a reset voltage;

a first sampling capacitor configured to store a first correlated double sampling value free from the offset deviation component by double sampling the pixel voltage and the reset voltage;

a second sampling capacitor configured to store a second correlated double sampling value free from the offset deviation component by double sampling the reference voltage and the reset voltage; and a comparing unit configured to generate the comparator output signal by comparing the first correlated double sampling value with the second correlated double sampling value.

2. The current sensing device of claim 1, wherein one electrode of the first sampling capacitor is connected to an output terminal of the first current-voltage converter, and another electrode of the first sampling capacitor is connected to an inverting input terminal of the comparing unit, and wherein one electrode of the second sampling capacitor is connected to an output terminal of the second current-voltage converter, and another electrode of the second sampling capacitor is connected to a non-inverting input terminal of the comparing unit.

3. The current sensing device of claim 2, wherein the current comparator further comprises:

a driving voltage input terminal to which a driving voltage is applied;

a first sampling switch configured to control a current flow between the other electrode of the first sampling capacitor and the driving voltage input terminal; and a second sampling switch configured to control a current flow between the other electrode of the second sampling capacitor and the driving voltage input terminal.

4. The current sensing device of claim 3, wherein the first and second sampling switches maintain their on states while the first reset voltage and second reset voltage are sampled, and maintain their off states while the pixel voltage and the reference voltage are sampled.

5. The current sensing device of claim 3, wherein the reference current generator generates the reference current of a constant level, wherein the current comparator outputs the comparator output signal as a first logic value when the first correlated double sampling value is smaller than the second correlated double sampling value, outputs the comparator output signal as a second logic value when the first correlated double sampling value is equal to the second correlated double sampling value, and outputs the comparator output signal as a third logic value when the first correlated double sampling value is larger than the second correlated double sampling value, and wherein the digital sensing value corresponding to the pixel current is different depending of the first, second and third logic values of the comparator output signal.

6. The current sensing device of claim 3, wherein the reference current generator generates the reference current increasing at a constant slope, wherein the current comparator further comprises a counter configured to output count information of n bits to the edge triggered data flip-flop, n being an integer, and wherein the edge triggered data flip-flop inverts a logic value of the comparator output signal at an instant when the first correlated double sampling value becomes greater than the second correlated double sampling value, and outputs the count information synchronized with a logic inverting timing of the comparator output signal as the digital sensing value corresponding to the pixel current.

7. The current sensing device of claim 6, the reference current generator is of thermometer type, wherein the reference current generator comprises a logic circuit and current cells generating an analog ramp current responding to the digital code value output from the logic circuit.

8. The current sensing device of claim 2, wherein the first current-voltage converter converts the pixel current into the pixel voltage and converts the reset current into the first reset voltage through the output terminal a current path of which is cut off, and wherein the second current-voltage converter converts the reference current into the reference voltage and converts the reset current into the second reset voltage through the output terminal a current path of which is cut off.

9. The current sensing device of claim 8, wherein the output terminal of the first current-voltage converter is connected to a gate terminal of a MOS switch connected to the inverting input terminal of the comparing unit, and the output terminal of the second current-voltage converter is connected to a gate terminal of a MOS switch connected to the non-inverting input terminal of the comparing unit.

10. The current sensing device of claim 1, wherein at least two or more sensing units of the plurality of sensing units share a same second current-voltage converter.

11. An organic light emitting display device, comprising:

a display panel equipped with a plurality of pixels and sensing lines connected to the pixels;

the plurality of sensing units of claim 1, the plurality of sensing units being connected to the sensing lines through sensing channels and sensing driving characteristics of the pixels; and a timing controller configured to compensate for digital image data to be written to the display panel based on digital sensing values input from the sensing units.

* * * * *